United States Patent
Feldhues et al.

(10) Patent No.: US 8,535,870 B2
(45) Date of Patent: Sep. 17, 2013

(54) ORGANIC PIGMENTS FOR COLOUR FILTERS

(75) Inventors: Ulrich Feldhues, Bergisch Gladbach (DE); Frank Linke, Cologne (DE); Ronald Gobel, Leverkusen (DE); Dirk Pfuetzenreuter, Burscheid (DE); Udo Herrmann, Dormagen (DE)

(73) Assignee: LANXESS Deutschland GmbH, Cologne (DE)

( * ) Notice: Subject to any disclaimer, the term of this patent is extended or adjusted under 35 U.S.C. 154(b) by 0 days.

(21) Appl. No.: 13/313,521

(22) Filed: Dec. 7, 2011

(65) Prior Publication Data

US 2012/0077123 A1    Mar. 29, 2012

Related U.S. Application Data

(62) Division of application No. 11/487,707, filed on Jul. 17, 2006, now Pat. No. 8,114,558.

(30) Foreign Application Priority Data

Jul. 19, 2005    (DE) .......................... 10 2005 033 581

(51) Int. Cl.
*G03F 7/004* (2006.01)
*C09C 1/00* (2006.01)

(52) U.S. Cl.
USPC ........................................ 430/270.1; 106/480

(58) Field of Classification Search
None
See application file for complete search history.

(56) References Cited

U.S. PATENT DOCUMENTS

| | | |
|---|---|---|
| 6,203,604 B1 | 3/2001 | Kashiwazaki et al. |
| 6,211,346 B1 | 4/2001 | Linke et al. |
| 6,261,358 B1 | 7/2001 | Sommer et al. |
| 6,350,307 B1 | 2/2002 | Linke et al. |
| 6,596,446 B2 | 7/2003 | Wolf et al. |
| 2002/0034696 A1 | 3/2002 | Wolf et al. |
| 2002/0111465 A1 | 8/2002 | Linke et al. |
| 2002/0187108 A1 | 12/2002 | Rajaiah et al. |
| 2005/0219443 A1 | 10/2005 | Tanaka et al. |
| 2005/0241532 A1 | 11/2005 | Feldhues et al. |

FOREIGN PATENT DOCUMENTS

| | | |
|---|---|---|
| DE | 10213980 A1 | 10/2003 |
| DE | 10328999 A1 | 1/2005 |
| JP | 11217514 A | 8/1999 |
| JP | 2001108905 | 4/2001 |

OTHER PUBLICATIONS

Rompp Lezikon, Lacke und Druckfarben, Dr. Ulrich Zorll, Thieme Verlan, Stuttgart, New York, 1998, pp. 445-446 and 491-492.

*Primary Examiner* — John A. McPherson
(74) *Attorney, Agent, or Firm* — Michael A. Miller

(57) ABSTRACT

Use of pigments of the formula (I)

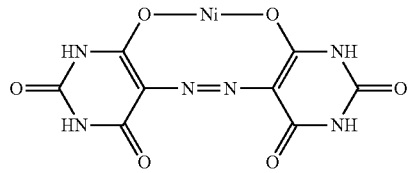

containing melamine as guest compound and having a dispersion harshness of more than 250 as pigments for color filters for liquid-crystal displays.

2 Claims, No Drawings

ORGANIC PIGMENTS FOR COLOUR FILTERS

This application is a divisional of U.S. application Ser. No. 11/487,707, filed Jul. 17, 2006, which is pending, which claims the benefit of German Application No. 10 2005 033 581.0 filed Jul. 19, 2005, all incorporated herein by reference.

The invention relates to the use of specific nickel azo pigments of the formula (I) containing melamine as guest compound for producing colour filters for liquid-crystal displays, and also to the colour filters comprising said pigments and the liquid-crystal displays comprising them.

Colour filters are chiefly employed today in liquid-crystal displays and screens, colour resolution instruments, and sensors. One known example are the flat screens on personal computers. There are various ways to produce colour filters, which differ not only in the way the colours are applied but also in the generation of the colour element patterns from the primary colours red, green and blue, as well as black. The colours may be applied, for example, by colouring a base layer (e.g. gelatin) by means of soluble dyes or pigments ("dye method", "dye dispersion method"), screen printing, offset printing or ink-jet printing of pigment pastes, pigment formulations or pigment inks, electrodeposition of photoresists based on dyes or pigments, and also, in particular, by means of the pigment dispersion method, which uses pigments dispersed either in a polyimide resin ("non-photosensitive polyimide method") or in a photoresist ("photosensitive acrylic method"). Associated with the stated methods, both the direct generation of the colour element patterns, by printing, and their indirect, photolithographic generation, are important, the latter in relation to the aforementioned pigment dispersion method in particular. The technique of the pigment dispersion method in the form of the "non-photosensitive poly-imide method", for example, is disclosed in JP-A-11-217514 (1998).

In the case of the pigment dispersion method involving a photoresist, the colour-imparting pigments are in fine dispersion in a UV-curable photoresist. The photoresist, as well as the pigment, is generally composed of binder resin, polymerizable monomer, photoinitiator and, optionally, a solvent component. It is prepared by, for example, first finely dispersing the pigment in the form of a concentrate in solvent, and, optionally, binder resin, and adjusting the dispersion immediately prior to application together with the monomer and the photoinitiator and also any further components. The pigmented photoresist is applied uniformly to the substrate, glass for example, by means for example of the spincoating method, and is predried, UV-exposed by means of a photomask, developed to the desired colour element patterns by means of a generally inorganic alkaline solution, and the coating is cleaned and optionally aftercured. This operation is repeated for each colour, i.e. generally three times for a trichromatism in the colours red, green and blue, for example.

The advantages associated with the use of pigments in conjunction with the pigment dispersion method lie in the improved light resistance, moisture resistance and thermal resistance of the colour filters as compared with dye-based coating systems. On the other hand, the transparency and colour purity of coatings based on pigments, irrespective of the coating method, are still unsatisfactory. Particularly when different pigments are incorporated in a mixture to shade the mixture to the desired colour locus values in a photoresist, there are unwanted losses in brilliancy and transparency, with the result that operation of the displays or screens (LCDs) unavoidably entails an increased energy cost.

EP-A-947563 describes specific azo pyrazolones for use in colour filters.

EP 0994162 and DE 10328999 claim nickel azo pigments which have a dispersion harshness<250 (in accordance with DIN 53775). Their use is claimed for, in principle, all end uses of pigments. The advantages of the nickel azo pigments having a dispersion harshness<250 in the context of their use, among other things, for producing printing inks, distempers or binder colours, for the mass colouring of synthetic, semi-synthetic or natural macromolecular substances, and for printing textiles and paper is demonstrated by examples.

U.S. Pat. No. 6,596,446 describes the use of nickel azo pigments for colour filters in LCDs and processes for producing them. The nickel azo pigments claimed in U.S. Pat. No. 6,596,446 for colour filters in LCDs are not subject in principle to any restriction with regard to their dispersion harshness. U.S. Pat. No. 6,596,446 claims a preferred dispersion harshness range of <250.

The yellow-green colour component is composed preferably of the CI Pigment Green 36 and a yellow metal azo pigment. For the purpose of improved capacity for combination with the other hues, the yellow-green colour component is advantageously highly chromatic and highly transparent. For this purpose the yellow pigment must be highly chromatic and transparent.

It has now been found that the described properties of the green hue can be markedly improved if the yellow component used is the pigment employed in accordance with the invention.

The invention relates to the use of pigments of the formula (I)

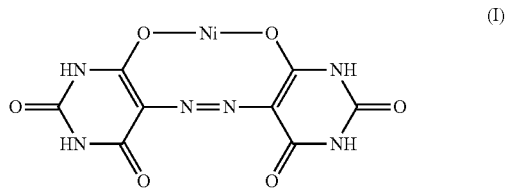

or tautomeric structures thereof and/or hydrates thereof, containing melamine as guest compound, as pigments for colour filters for liquid-crystal displays, characterized in that the said pigments have a dispersion harshness of more than 250. (In accordance with the invention the dispersion harshness is measured in accordance with DIN 53775.)

It is apparent, surprisingly, that the said pigments with dispersion harshnesses of more than 250 surprisingly exhibit a relatively high transparency and colour purity.

In one preferred embodiment the said pigment used in accordance with the invention is used together with Pigment Green 36 pigment.

Based on its total amount, the pigment hosts preferably 10% to 100% by weight of Melamine as a guest compound. This is the amount of melamine which cannot be removed by washing with appropriate solvents and which is apparent from the elemental analysis. It is of course also possible to add more or less than the stated amount of melamine, and as an option it is possible not to wash out any excess. Preference is given to amounts of 10% to 150% by weight.

Particular preference is given to the 1:1 azo barbituric acid-nickel complex of the formula (I), or one of its tautomeric forms, which includes two molecules of melamine per atom of nickel. In the context of this specification, the hydrates of the stated pigments are always embraced as well.

Very particular preference for use for colour filters in LCDs is given to 1:1 azo barbituric acid-nickel complexes of the formula (I) which are heat-treated, preferably at a pH of 2.5-3.5, in particular at a pH of 2.7-3.3, and include melamine. Improved colour strength can be achieved by means of heat treatment in at least two pH stages in the range from 0 to 4.

For the purposes of this specification the nickel complexes of the azo compounds of the formula (I) that contain melamine as a guest compound and have a dispersion harshness>250 (in accordance with DIN 53775) are referred to as pigments used in accordance with the invention. The nickel complex pigments preferably have a dispersion harshness>250 and <1000, in particular >300 and <500.

Although a dispersion harshness of >1000 does also result in the desired transparency, it can lead to technical problems in application, in particular to a reduction in the storage stability of the pigment dispersions, and for that reason is less preferred.

The dispersion harshness is measured in accordance with DIN 53775, Part 7, the temperature of cold rolling being 25° C. and that of hot rolling being 150° C. All of the dispersion harshnesses reported in this specification were determined in accordance with this modified DIN specification.

The pigment preferably possesses a specific surface area of 120 to 180 $m^2/g$, in particular 130 to 170 $m^2/g$, more preferably 140 to 160 $m^2/g$, very preferably 150 to 160 $m^2/g$. Comparatively high specific surface areas and improved reproducibility can be achieved through the use of seed crystals or through the deployment of a pumped circulation during the production of the pigments.

The surface area is determined in accordance with DIN 66131: Determination of specific surface area of solids by gas adsorption by the method of Brunauer, Emmett and Teller (B.E.T.).

For the skilled worker it is particularly surprising that the inventive use of pigments having a dispersion harshness of >250 has advantages in the production of colour filters.

This is all the more surprising in view of the fact that, for the specific nickel azo pigments described in EP 0994162 and in DE 10328999, the degree of preference of their claiming increases as the dispersion harshness of the nickel azo pigments becomes lower (preferably <200, in particular <150).

The specific nickel azo pigments described in EP 0994162 and in DE 10328999, having a dispersion harshness<250 (in accordance with DIN 53775), are already valuable pigments and have very good processing properties, but do not attain optimum transparency in colour filters.

The nickel azo pigments of the invention can be produced by reacting preferably an alkali metal salt, such as Na, Li or, in particular, K salt, of azo barbituric acid in an aqueous system with melamine and a nickel salt in any order and then heat-treated in the reaction product at a pH preferably of 2.5-3.5, in particular of 2.7-3.3. Through the choice of the heat treatment conditions in particular (pH, temperature and duration) it is possible to set the dispersion harshness in the desired range, in a way known to the skilled worker. The heat treatment conditions are adapted advantageously to the dispersion harshness of the material formed initially in the synthesis.

The inventive use of the above-described pigments, or that of the pigment formulations of the invention, for producing colour filters for liquid-crystal displays will be described below with reference to the example of the pigment dispersion method encompassing the photoresist method.

The inventive use of the pigment formulations of the invention for producing colour filters is characterized for example in that the "pigment" or the pigment formulation, especially the solid pigment formulation, optionally with a binder resin and with an organic solvent, optionally with addition dispersant, is homogenized and then subjected to continuous or batchwise wet-comminution to a particle size by number (electron-microscopic determination) of 99.5%<1000 nm, preferably 95%<500 nm and in particular 90%<200 nm. Suitable wet-comminution methods include, for example, stirrer or dissolver dispersion, grinding by means of stirred bore mills or bead nulls, kneaders, roll mill, high-pressure homogenization or ultrasonic dispersion.

The dispersing treatment is accompanied or followed by the addition of at least one photocurable monomer and a photoinitiator. Following dispersion, further binder resin, solvent or customary photoresist adjuvants may be introduced as is necessary for the desired photosensitive coating formulation (photoresist). For the purposes of this invention, a photoresist is a formulation comprising at least one photocurable monomer and a photoinitiator in addition to the stated pigment.

Useful dispersants include generally commercially available dispersants, such as polymeric, ionic or nonionic dispersants, based for example on polycarboxylic acids or polysulphonic acids, and also polyethylene oxide-polypropylene oxide block copolymers. Derivatives of organic dyes can also be used, furthermore, as dispersants or co-dispersants.

The production of colour filters therefore gives rise to "formulations" which comprise, based on the formulation:
- at least one nickel salt of the formula (I) containing melamine as a guest compound and having a dispersion harshness>250, referred to for the purposes of this specification as pigment of the invention,
- optionally a binder resin,
- at least one organic solvent, and
- optionally a dispersant.

In one preferred embodiment the formulation contains (amounts based on formulation):
1%-50% by weight of a pigment as defined above
0-20% by weight of binder resin
0-20% by weight of dispersant
10%-94% by weight of organic solvent.

The coating of the photoresist onto a plate to produce the coloured image element pattern can be carried out by either direct or indirect application. Examples of application methods that may be mentioned include roller coating, spincoating, spray coating, dip coating and air knife coating.

Examples of suitable plates include, depending on use, the following: transparent glasses such as white or blue glass plate, silicate-coated blue glass plate, synthetic resin plate or synthetic resin films based for example on polyester resin, polycarbonate resin, acrylic resin or vinyl chloride resin, and additionally metal plates based on aluminum, copper, nickel or steel, and also ceramic plates or semiconductor plates with photoelectric transfer elements applied.

Application is generally effected in such a way that the photosensitive layer obtained is 0.1 to 10 μm thick.

Application may be followed by thermal drying of the layer.

Exposure takes place preferably by exposing the photosensitive layer to an active light beam in the form, preferably, of an image pattern by means of photomask. This cures the layer at the exposed areas. Examples of suitable light sources include the following: high-pressure and ultrahigh-pressure mercury vapour lamp, xenon lamp, metal halide lamp, fluorescent lamp, and laser beam in the visible region.

Development following exposure removes the unexposed portion of the coating, to give the desired image pattern form of the colour elements. Customary development methods include spraying with or dipping in aqueous alkaline developer solution or in an organic solvent that contains inorganic alkali such as, for example, sodium hydroxide or potassium hydroxide, sodium metasilicate or organic bases such as monoethanolamine, diethanolamine, triethanolamine, triethylamine or salts thereof.

Development is generally followed by thermal afterdrying/-curing of the image patterns.

Further Pigments:

The use of the "pigments" as defined above is preferably characterized in that they are employed alone or in a mixture with "other pigments" in the colour filters or pigment formulations or colour filter preparation.

By "other pigments" are meant not only other metal salts of an azo compound of the formula (I) or pigment formulations based thereon but also other organic pigments.

With regard to the selection of other pigments for optional use, the invention does not impose any restriction. Both organic and inorganic pigments are appropriate.

Preferred organic pigments are, for example, those of the monoazo, diazo, lacked azo, β-naphthol, Napthol AS, benzimidazolone, diazo condensation, azo metal complex, isoindoline and isoindolinone series, and also polycyclic pigments such as, for example, those from the phthalocyanine, quinacridone, perylene, perinone, thioindigo, anthraquinone, dioxazine, quinophthalone and diketopyrrolopyrrole series. Additionally, lacked dyes such as Ca, Mg and Al lacks of dyes containing sulphonic acid or carboxylic acid groups.

Examples of other organic pigments for optional use are:

Yellow Pigments of

Colour Index Pigment Yellow 12, 13, 14, 17, 20, 24, 74, 83, 86, 93, 94, 109, 110, 117, 125, 137, 138, 139, 147, 148, 150, 153, 154, 166, 173, 185, or Colour Index Pigment Orange 13, 31, 36, 38, 40, 42, 43, 51, 55, 59, 61, 64, 65, 71, 72, 73 or Colour Index Pigment Red 9, 97, 122, 123, 144, 149, 166, 168, 177, 180, 192, 215, 216, 224, 254, 272, or Colour Index Pigment Green 7, 10, 36, 37, 45, or Colour Index Pigment Blue 15, 15:1, 15:2, 15:3, 15:4, 15:6, 16, and Colour Index Pigment Violet 19, 23.

Where "other pigments" are used additionally, the fraction of "pigment" as defined above is preferably 1-99% by weight, in particular 20-80% by weight, based on the total amount employed of all pigments.

Particular preference is given to the pigment formulations of the invention and to preparations that comprise "pigments" as defined above and C.I. Pigment Green 36 in a proportion of 20%-80% "pigment" to 80%-20% C.I. Pigment Green 36, preferably of 40%-60% to 60%-40%.

As binder resins which can be used together with the "pigment" or pigment formulations based therein in colour filters or in the preparations for producing colour filters by, for example, the pigment dispersion method, the invention imposes no particular restriction; conventional film-forming resins in particular are suitable for application in colour filters.

By way of example, binder resins from the group of the cellulose resins such as carboxy-methylhydroxyethylcellulose and hydroxyethylcellulose, acrylic resins, alkyd resins, melamine resins, epoxy resins, polyvinyl alcohols, polyvinylpyrrolidones, polyamides, polyamide-imines, polyimides, polyimide precursors such as those of formula (14) disclosed in JP-A 11 217 514 and esterification products thereof are suitable.

Examples thereof include reaction products of tetracarboxylic dianhydride with diamines.

Suitable binder resins also include those containing photopolymerizable, unsaturated binders. The binder resins may for example be resins from the group of the acrylic resins. Mention may be made in particular of homopolymers and copolymers of polymerizable monomers such as methyl (meth)acrylate, ethyl(meth)acrylate, propyl(meth)acrylate, butyl(meth)acrylate, styrene and styrene derivatives, and additionally copolymers between carboxyl-bearing polymerizable monomers such as (meth)acrylic acid, itaconic acid, maleic acid, maleic anhydride, maleic acid monoalkyl esters, particularly with alkyl of 1 to 12 carbon atoms, and polymerizable monomers such as (meth)acrylic acid, styrene and styrene derivatives, such as α-methylstyrene, m- or p-methoxystyrene, p-hydroxystyrene, for example. Examples that may be mentioned are reaction products of carboxyl-containing polymeric compounds with compounds which contain in each case one oxirane ring and an ethylenically unsaturated bond such as, for example, glycidyl(meth)acrylate, acryloyl glycidyl ether and itaconic acid monoalkylglycidyl esters, etc., and also reaction products of carboxyl-containing polymeric compounds with compounds containing one hydroxyl group and an ethylenically unsaturated bond (unsaturated alcohols), such as allyl alcohol, 2-buten-4-ol, oleyl alcohol, 2-hydroxyethyl(meth)acrylate, N-methylolacrylamide, etc; binder resins of this kind may further comprise unsaturated compounds which possess free isocyanate groups.

In general the equivalence of the unsaturation (molar weight of binder resin per Unsaturated bond) of the said binder resins is 200 to 3000, in particular 230 to 1000, to provide not only adequate photopolymerizability but also film hardness. The acid value is generally 20 to 300, in particular 40 to 200, to provide sufficient alkali developability following exposure of the film.

The average molar weight of the binder resins to be used is between 1500 and 200 000, in particular 10 000 to 50 000 g/mol.

The organic solvents used in the context of the inventive use of the pigment formulations for colour filters are, for example, ketones, alkylene glycol ethers, alcohols and aromatic compounds. Examples are, from the group of the ketones: acetone, methyl ethyl ketone, cyclohexanone, etc.; from the group of the alkylene glycol ethers: methylcellosolve (ethylene glycol monomethyl ether), butylcellosolve (ethylene glycol monobutyl ether), methylcellosolve acetate, ethylcellosolve acetate, butylcellosolve acetate, ethylene glycol monopropyl ether, ethylene glycol monohexyl ether, ethylene glycol dimethyl ether, diethylene glycol ethyl ether, diethylene glycol diethyl ether, propylene glycol monomethyl ether, propylene glycol monoethyl ether, propylene glycol monopropyl ether, propylene glycol monobutyl ether, propylene glycol monomethyl ether acetate, diethylene glycol methyl ether acetate, diethylene glycol ethyl ether acetate, diethylene glycol propyl ether acetate, diethylene glycol isopropyl ether acetate, diethylene glycol butyl ether acetate, diethylene glycol tert-butyl ether acetate, triethylene glycol methyl ether acetate, triethylene glycol ethyl ether acetate, triethylene glycol propyl ether acetate, triethylene glycol isopropyl ether acetate, triethylene glycol butyl ether acetate, triethylene glycol tert-butyl ether acetate, etc.; from the group of the alcohols: methyl alcohol, ethyl alcohol, isopropyl alcohol, n-butyl alcohol, 3-methyl-3-methoxybutanol, etc.; and, from the group of the aromatic solvents, benzene, toluene, xylene, N-methyl-2-pyrrolidone, ethyl N-hydroxymethylpyrrolidone-2-acetate, etc.

Further other solvents are 1,2-propanediol diacetate, 3-methyl-3-methoxybutyl acetate, ethyl acetate, tetrahydrofuran, etc. The solvents can be used individually or in mixtures with one another.

The invention further provides a photoresist comprising at least one pigment as defined above or at least one pigment formulation of the invention and at least one photocurable monomer and also at least one photoinitiator.

The photocurable monomers contain at least one reactive double bond and optionally other reactive groups in the molecule.

Photocurable monomers may be interpreted in this context as being, in particular, reactive solvents or what are called reactive diluents from the group, for example, of the mono-, di-, tri- and multifunctional acrylates and methacrylates, vinyl ethers, and glycidyl ethers. Suitable reactive groups additionally present include allyl, hydroxyl, phosphate, urethane, secondary amine and N-alkoxymethyl groups.

Monomers of this kind are known to the skilled person and are listed for example in [Römpp Lexikon, Lacke und Druckfarben, Dr. Ulrich Zorll, Thieme Verlag Stuttgart-New York, 1998, pp. 491/492].

The selection of the monomers is guided in particular by the nature and intensity of the exposing radiation used, the desired reaction with the photoinitiator, and the film properties. Monomer combinations can also be used.

Photoreaction initiators or photoinitiators may be understood as being compounds which by absorbing visible or ultraviolet radiation form reactive intermediates that are capable of inducing a polymerization reaction on the part, for example, of the abovementioned monomers and/or binder resins. Photoreaction initiators are likewise general knowledge and may likewise be taken from [Römpp Lexikon, Lacke und Druckfarben, Dr. Ulrich Zorll, Thieme Verlag Stuttgart-New York, 1998, pp. 445/446].

The invention imposes no restriction with regard to the photocurable monomers or photoinitiators that are to be employed.

The invention preferably provides photoresists comprising
A) at least one "pigment" as defined above, in particular in a mixture with other pigments, preferably C.I. Pigment Green 36 or a pigment formulation of the invention that is based thereon,
B1) at least one photocurable monomer,
B2) at least one photoinitiator,
C1) optionally an organic solvent,
D) optionally a dispersant,
E) optionally a binder resin,
and optionally further additions.

The invention also imposes no restriction with regard to the technology for generating the coloured image element patterns on the basis of the solid pigment formulations or pigments for use in accordance with the invention. In addition to the above-described photolithographic method, other methods such as offset printing, chemical milling or ink-jet printing are also suitable. The selection of suitable binder resins and solvents or pigment vehicles, and of further additions, should be conformed to the particular method. In the case of the ink-jet method, which comprehends not only thermal but also mechanical and piezomechanical ink-jet printing, suitable vehicles for the pigments and optionally binder resins include not only purely organic vehicles but also aqueous-organic vehicles; aqueous-organic vehicles are in fact preferred.

EXAMPLES

Preparation of Example 1

Non-Inventive Pigment 1 mol of diazobarbituric acid is reacted in 8 liters of 90° C.-hot water with 1 mol of barbituric acid under KOH titration at a pH of 5. 2 mol of melamine are added. The pH is set to 5 with hydrochloric acid. 1 mol of a 40% strength nickel chloride solution is added dropwise. After 1 h at 90° C. the pH is set to 5 with KOH. The pH is subsequently set to 2.0 with hydrochloric acid and heat treatment is carried out at 98° C. for 4 h. Thereafter the pH is set to 5 with KOH. Subsequently the pigment is isolated on a suction filter, washed, dried at 80° C. in a vacuum drying oven and ground in a standard laboratory mill for around 2 minutes.

Dispersion harshness: 220 BET: 120 m$^2$/g

Preparation Example 2

Inventive Pigment 1 mol of diazobarbituric acid is reacted in 8 liters of 90° C.-hot water with 1 mol of barbituric acid under KOH titration at a pH of 5. 2 mol of melamine are added. The pH is set to 5 with hydrochloric acid. 1 mol of a 40% strength nickel chloride solution is added dropwise. After 1 h at 90° C. the pH is set to 5 with KOH. The pH is subsequently set to 3.2 with hydrochloric acid and heat treatment is carried out at 98° C. for 8 h. Thereafter the pH is set to 5 with KOH. Subsequently the pigment is isolated on a suction filter, washed, dried at 80° C. in a vacuum drying oven and ground in a standard laboratory mill for around 2 minutes.

Dispersion harshness: 490 BET: 159 m$^2$/g

Preparation Example 3

Inventive Pigment 1 mol of diazobarbituric acid is reacted in 8 liters of 90° C.-hot water with 1 mol of barbituric acid under KOH titration at a pH of 5. 2 mol of melamine are added. The pH is set to 5 with hydrochloric acid. 1 mol of a 40% strength nickel chloride solution is added dropwise. After 1 h at 90° C. the pH is set to 5 with KOH. The pH is subsequently set to 3.0 with hydrochloric acid and heat treatment is carried out at 98° C. for 8 h. Thereafter the pH is set to 5 with KOH. Subsequently the pigment is isolated on a suction filter, washed, dried at 80° C. in a vacuum drying oven and ground in a standard laboratory mill for around 2 minutes.

Dispersion harshness: 420 BET: 155 m$^2$/g

Preparation Example 4

Inventive Pigment 1 mol of diazobarbituric acid is reacted in 8 liters of 90° C.-hot water with 1 mol of barbituric acid under KOH titration at a pH of 5. 2 mol of melamine are added. The pH is set to 5 with hydrochloric acid. 1 mol of a 40% strength nickel chloride solution is added dropwise. After 1 h at 90° C. the pH is set to 5 with KOH. The pH is subsequently set to 3.0 with hydrochloric acid and heat treatment is carried out at 98° C. for 12 h. Thereafter the pH is set to 5 with KOH. Subsequently the pigment is isolated on a suction filter, washed, dried at 80°

C. in a vacuum drying oven and ground in a standard laboratory mill for around 2 minutes.

Dispersion harshness: 390 BET: 152 m²/g

Use Examples 1-4

Preparation of a Yellow Formulation and Use for Producing a Yellow Colour Filter In a stirred vessel 774 parts by weight of methoxybutyl acetate and 286 parts by weight of a 21% strength solution of an alkali-soluble copolymer (binder resin) based on benzyl methacrylate (70 parts)/2-hydroxyethyl methacrylate (15 parts)/methacrylic acid (15 parts), molar weight around 25 000 g/mol, in methoxypropyl acetate are mixed homogeneously.

In 100 parts by weight of a pigment from the preparation examples, dried beforehand at 70° C. to a residual moisture content of less than 1% by weight, are introduced homogeneously.

This pigment suspension is ground in a horizontal, sealed bead mill using yttrium-stabilized zirconium oxide beads (diameter 0.6 to 1.0 mm) in a number of passes until an effective particle diameter (measured with laser scattering light correlation spectroscopy on an approximately 0.5% by weight dilution in methoxypropyl acetate) of less than 150 nm is obtained in conjunction with a polydispersity of less than 0.14. (For comparison, a dried film of a 1% dilution in methoxypropyl acetate is observed under electron microscopy to have a very narrow particle size distribution, with 95% of the number of particles below 100 nm.)

The formulations obtained exhibit adequate storage stability. Use Examples 1-4, employing Preparation Examples 1-4, are highly suitable for producing a photoresist for colour filters by the pigment dispersion method.

Preparation of a Photoresist

Introduced homogeneously with stirring into 1000 parts by weight of the resulting formulations are 34.5 parts by weight of trimethylolpropane triacrylate (monomeric reactive diluent) and 13.8 parts by weight of a photoreaction initiator based on benzophenone and N,N'-tetraethyl-4,4'-diaminobenzophenone in a ratio of 3/1 parts by weight.

This gives a UV-curable photoresist, which is applied to a transparent substrate and developed to give the colour filter.

For this purpose the photo resist is spin-coated onto a section of cleaned borosilicate glass (Corning® 7059, Owens Corning Corp.) measuring 300×350 mm and is dried at 110° C. for 5 minutes in an oven under clean conditions to give a film approximately 1.5-2 µm thick.

The film, after cooling, is then UV-exposed at a dose of 200 mJ/cm² with an ultra-high-pressure mercury vapour lamp, by means of a negative mask to obtain the desired stripe image pattern, and then developed by means of 0.06% strength aqueous potassium hydroxide solution at room temperature, cleaned with fully demineralized water and dried. This is followed by a 30-minute aftercure at 235° C. in an oven under clean conditions.

The yellow colour filters 2, 3 and 4 of the invention, obtainable in this way, produced in accordance with Use Examples 2, 3 and 4 on the basis of Preparation Examples 2, 3 and 4, relative to the non-inventive colour filter 1, produced in accordance with Use Example 1 on the basis of Preparation Example 1, possess a markedly improved spectral transparency. The colour purity and brilliance of colour filters 2, 3 and 4 are excellent.

Use Example 5

Preparation of a Green Formulation and Use for Producing a Green Colour Filter

By the same method as described in Use Example 2, but using 40 parts by weight of the pigment from Preparation Example 2 and 60 parts by weight of the green organic pigment Heliogen® Green L9361 (Pigment Green 36, BASF AG) instead of 100 parts by weight of the dried pigment prepared according to Example 2, a formulation is prepared that features a high level of fine division and adequate long-term stability, and that is very well suited to the production of green photoresists for colour filters.

A photoresist prepared as described in Use Example 2, and a green, striped colour filter produced using it, possess very good spectral transparency properties and also excellent colour purity and brilliance.

What is claimed is:

1. Preparations comprising at least one pigment of the formula (I)

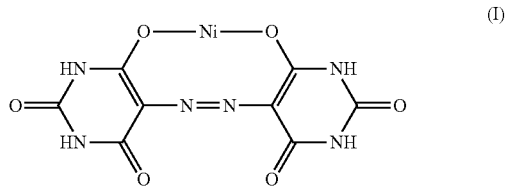

or tautomeric structures thereof and/or hydrates thereof, containing melamine as guest compound, having a dispersion harshness of more than 250, at least one organic solvent, optionally a binder resin and optionally a dispersant, wherein said preparations have a BET specific surface area of 120 to 180 m²/g.

2. Photoresist comprising at least one photocurable monomer, at least one photoinitiator and at least one pigment as defined in claim 1.

* * * * *